United States Patent
Baksh et al.

(10) Patent No.: US 12,160,238 B2
(45) Date of Patent: Dec. 3, 2024

(54) LOW POWER SINGLE PHASE LOGIC GATE LATCH FOR CLOCK-GATING

(71) Applicant: Advanced Micro Devices, Inc., Santa Clara, CA (US)

(72) Inventors: Nur Mohammad Baksh, Austin, TX (US); Deepesh John, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/563,980

(22) Filed: Dec. 28, 2021

(65) Prior Publication Data

US 2023/0208424 A1 Jun. 29, 2023

(51) Int. Cl.
*H03K 19/096* (2006.01)
*H03K 3/012* (2006.01)
*H03K 19/0185* (2006.01)

(52) U.S. Cl.
CPC ......... *H03K 19/0963* (2013.01); *H03K 3/012* (2013.01); *H03K 19/018521* (2013.01)

(58) Field of Classification Search
None
See application file for complete search history.

(56) References Cited

U.S. PATENT DOCUMENTS

| | | | |
|---|---|---|---|
| 7,760,117 B1* | 7/2010 | Chou | H03K 5/1565 327/51 |
| 2006/0221723 A1* | 10/2006 | Kang | H03K 3/356043 365/189.05 |
| 2013/0021078 A1* | 1/2013 | Elkin | H03K 3/356147 327/218 |
| 2013/0135017 A1* | 5/2013 | Jones | H03K 3/356173 327/155 |
| 2022/0415377 A1 | 12/2022 | Banerjee et al. | |
| 2022/0415378 A1 | 12/2022 | Banerjee et al. | |

* cited by examiner

*Primary Examiner* — Anh Q Tran
(74) *Attorney, Agent, or Firm* — Kowert, Hood, Munyon, Rankin & Goetzel, P.C.; Rory D. Rankin

(57) ABSTRACT

Systems, apparatuses, and methods for implementing a low-power single-phase logic gate latch for clock-gating are disclosed. A latch circuit includes shared clocked transistors without including clock inverters. The shared clocked transistors include a P-type clocked transistor and an N-type clocked transistor, with the clock input coupled to the gate of the P-type clocked transistor and to the gate of the N-type clocked transistor. The P-type clocked transistor is coupled between first and second transistor stacks of the latch. The N-type clocked transistor is coupled to a source gate of a first stack N-type transistor gated by a data input and to a source gate of a second stack N-type transistor gated by the inverted data input. The latch has a lower clock pin capacitance than a traditional logic gate latch while also avoiding having clock inverters which reduces dynamic power consumption.

20 Claims, 10 Drawing Sheets

LOW POWER SINGLE PHASE LOGIC GATE LATCH FOR CLOCK-GATING

BACKGROUND

Description of the Related Art

In modern microprocessor designs, power consumption has become one of the primary design constraints. Dynamic power is equal to switching activity*C*V$^2$*f, with C referring to capacitance, V referring to voltage, and f referring to frequency. To reduce the overall dynamic power of a circuit, a combination of various techniques and methodologies may be used. While voltage and frequency are product specific, the switching activity and AC capacitance of a circuit are typically targeted for design optimizations. A large portion of the total dynamic power is usually dissipated in the high activity circuits such as latches and flip-flops, along with the clock networks used to drive them. Latch circuits can comprise a significant portion of the digital design area as well as a considerable amount of the overall power consumption. Improving the design of latch circuits can reduce the area and/or reduce the power consumption of digital circuits.

Even though clock-gating techniques are used to reduce the activity of targeted logic signals and logic cones, the circuitry used for clock gating does not benefit from this activity reduction. In other words, the latches used in the coarse and fine-gating circuits still dissipate high idle dynamic power due to higher activity of the upstream input clocks. This is because the traditional transmission gate latch used for clock gates has two internal clock inverters. These clock inverters toggle even when the clock gating output remains gated off.

BRIEF DESCRIPTION OF THE DRAWINGS

The advantages of the methods and mechanisms described herein may be better understood by referring to the following description in conjunction with the accompanying drawings, in which.

DETAILED DESCRIPTION OF IMPLEMENTATIONS

In the following description, numerous specific details are set forth to provide a thorough understanding of the methods and mechanisms presented herein. However, one having ordinary skill in the art should recognize that the various implementations may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, and methods for implementing a low-power single-phase logic gate latch for clock-gating are disclosed herein. In one implementation, a latch circuit includes only two clocked transistors which are shared between the forward and feedback paths. As used herein, a "clock transistor" is a transistor with a clock signal connected to (i.e., driving) its gate. Also, the latch circuit is implemented without including clock inverters. The shared clocked transistors include a P-type clocked transistor and an N-type clocked transistor, with the clock input coupled to the gate of the P-type clocked transistor and to the gate of the N-type clocked transistor. The P-type clocked transistor is coupled between first and second cross-coupled transistor stacks of the latch. The N-type clocked transistor is coupled to a source gate of a first stack N-type transistor gated by a data input and to a source gate of a second stack N-type transistor gated by the inverted data input. The latch has a lower clock pin capacitance than a traditional logic gate latch while also avoiding having clock inverters which reduces dynamic power consumption.

Figure 1:
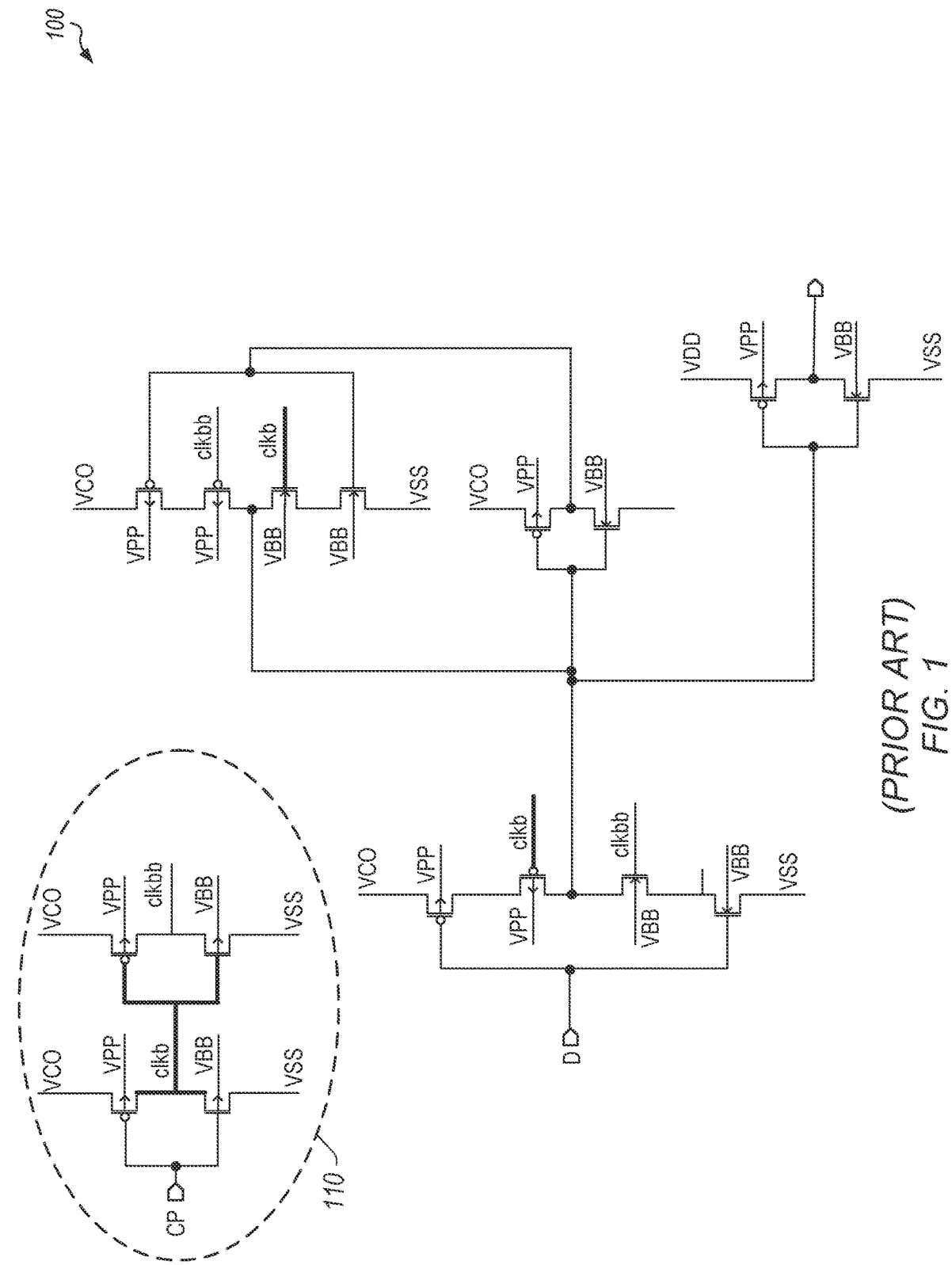
FIG. 1 is a block diagram of one implementation of a prior art transmission gate A-latch with two clock inverters.

Referring now to FIG. 1, a circuit diagram of one implementation of a prior art transmission gate A-latch 100 with two clock inverters is shown. As shown in highlighted portion 110, there are two clock inverters for the clock input received on the clock pin (CP). These two clock inverters will toggle with the clock and cause power to be dissipated even if the data is not changing. Accordingly, improvements to the design of latch 100 are desired.

Figure 2:
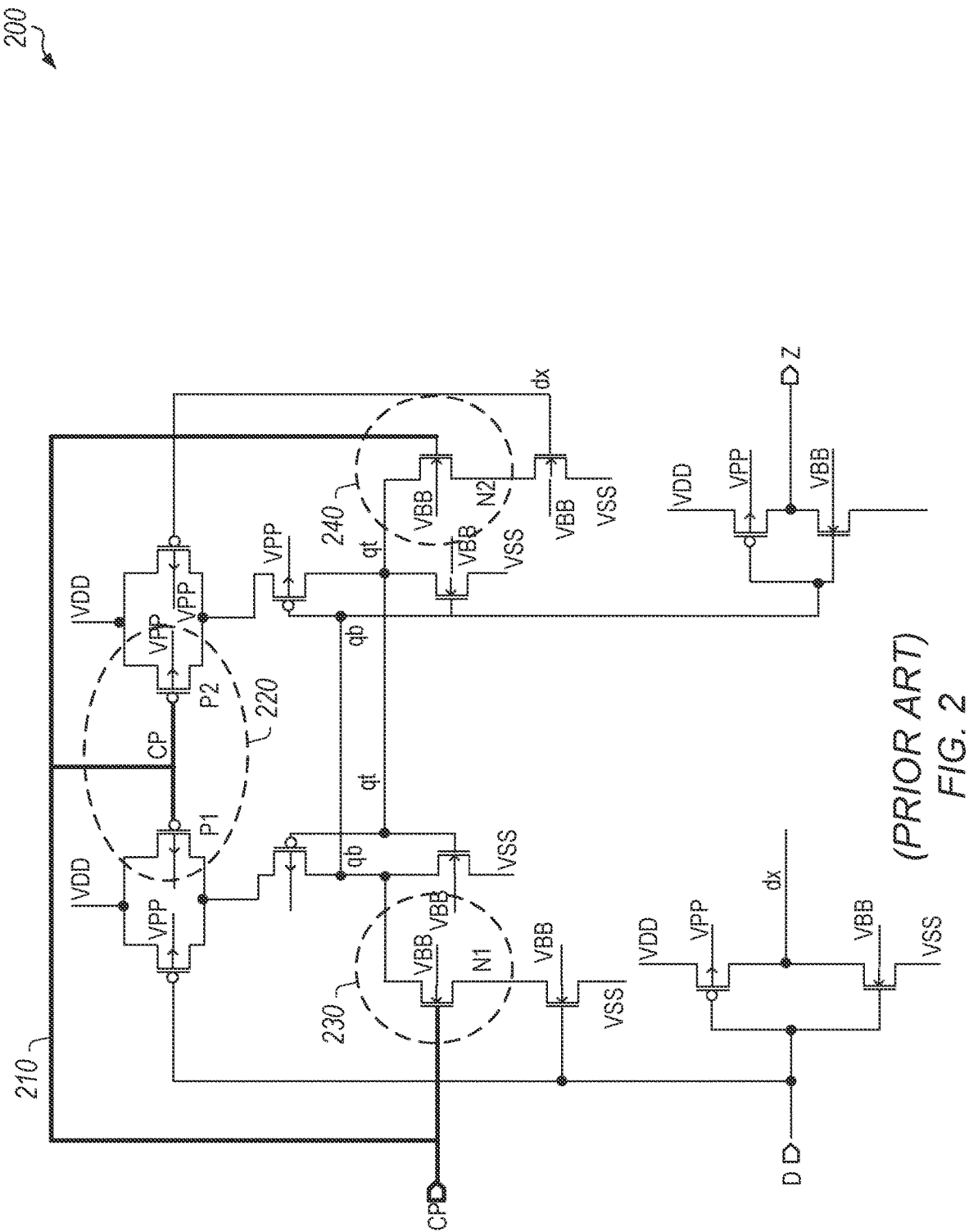
FIG. 2 is a block diagram of one implementation of a prior art logic gate A-latch.

Turning now to FIG. 2, a circuit diagram of one implementation of a prior art logic gate A-latch 200 is shown. While latch 200 does not have clock inverters as was the case for latch 100 (of FIG. 1), latch 200 does include four clocked transistors highlighted with circles 220, 230, and 240. In other words, the input clock 210 received on the clock pin (CP) is going to four clocked transistors, two P-type transistors and two N-type transistors. This increases the clock pin capacitance which is an undesirable effect.

Figure 3:
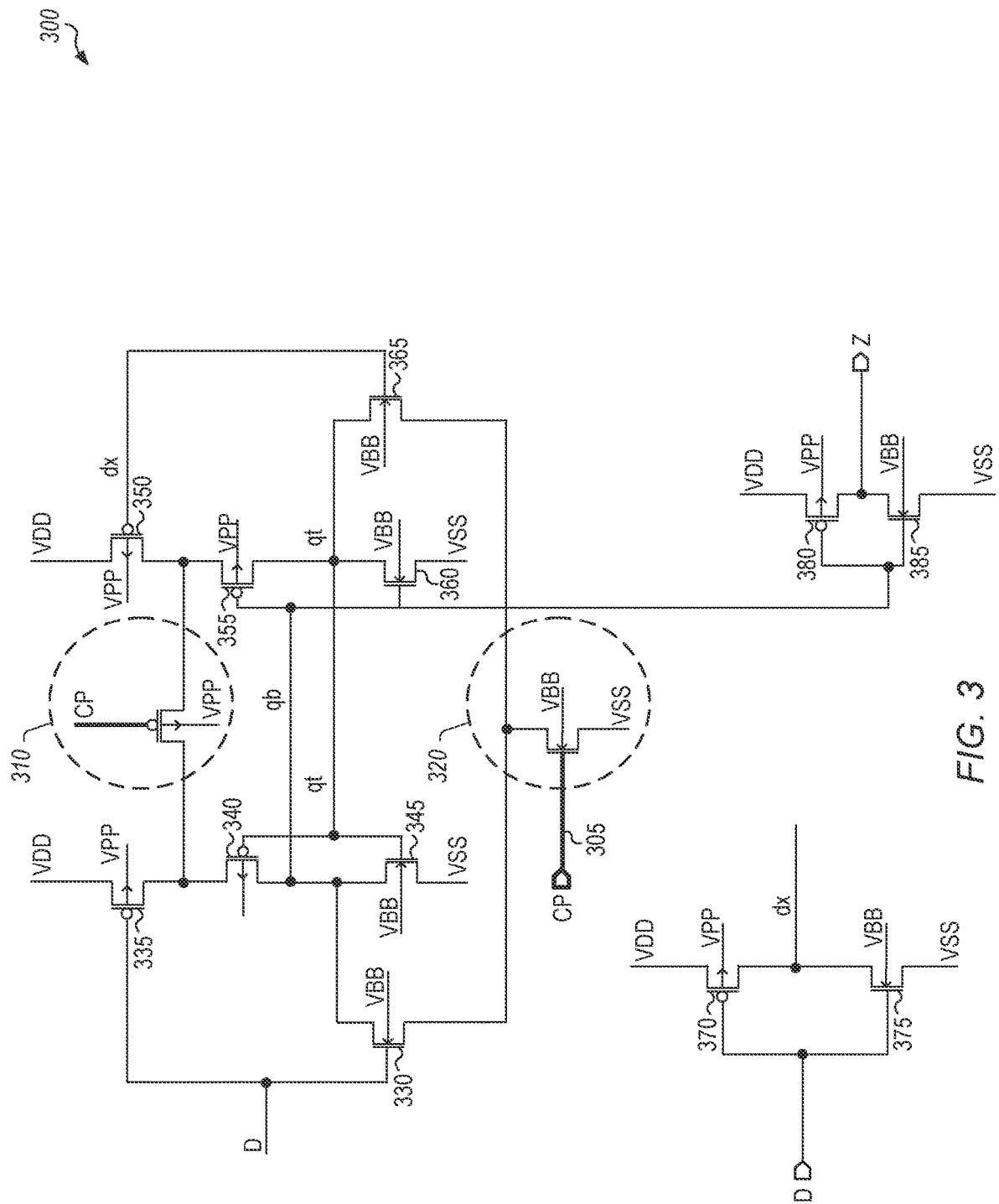
FIG. 3 is a block diagram of one implementation of an SR A-latch with a reduced number of clocked transistors.
Figure 4:
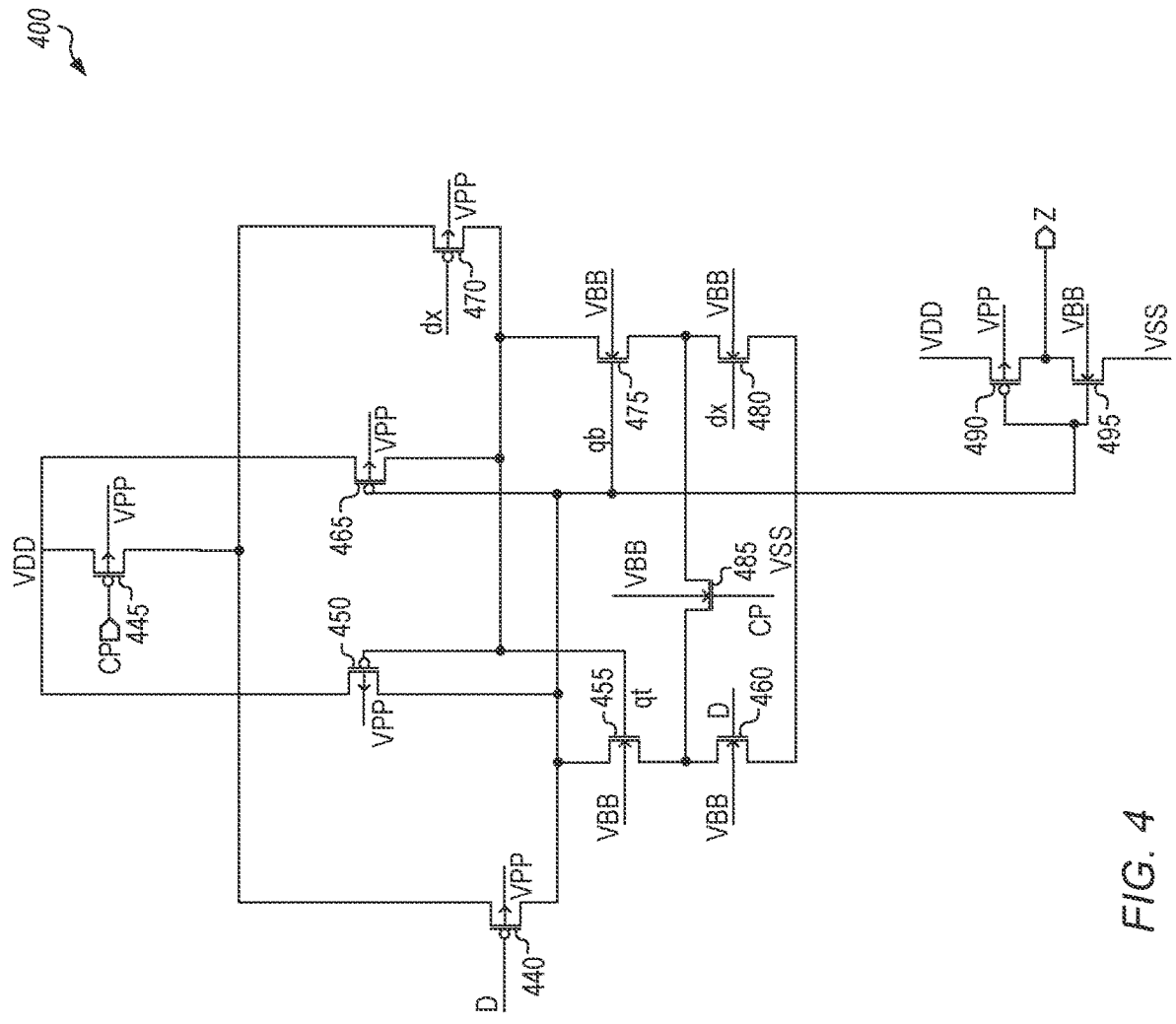
FIG. 4 is a block diagram of one implementation of an SR B-latch with a reduced number of clocked transistors.
Figure 4:
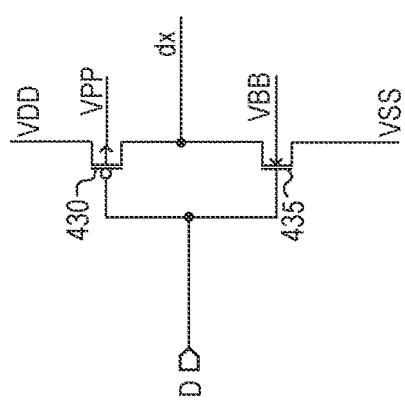

Referring now to FIG. 3, a circuit diagram of one implementation of an SR A-latch 300 with a reduced number of clocked transistors is shown. As compared with latch 200 of FIG. 2, there are two fewer clocked transistors for latch 300. These clocked transistors are P-type transistor 310 and N-type transistor 320. As shown, the clock input on clock pin 305 is coupled to the gate of P-type transistor 310 and to the gate of N-type transistor 320. This is a reduction as compared to latch 200 which had the clock input connected to the gates of four transistors. This means that latch 300 has half the clock pin capacitance as latch 200 and reduced clock fan-out. Latch 300 sets the output data signal (or Z) based on the input data signal (or D) and the clock input received on clock pin 305. A similar low-power implementation of an SR B-latch is shown in FIG. 4 and described in further detail below.

As shown in FIG. 3, latch 300 includes two cross-coupled transistor stacks. These two cross-coupled transistor stacks include a first transistor stack receiving the input data signal and a second transistor stack receiving the inverted input data signal. The first transistor stack includes P-type transistor 335, P-type transistor 340, and the parallel arrangement of N-type transistors 330 and 345. The input data signal is coupled to the gates of P-type transistor 335 and N-type transistor 330. The source port of P-type transistor 335 is coupled to the supply voltage (i.e., VDD) and the drain port of P-type transistor 335 is coupled to the source port of P-type transistor 340 and to the drain port of P-type clocked transistor 310. The drain port of P-type transistor 340 is coupled to the drain ports of N-type transistors 330 and 345 and to the gates of P-type transistor 355 and N-type transistor 360, with this net labeled as "qb". The net labeled as "qb" is also coupled to the gates of P-type transistor 380 and N-type transistor 385, with P-type transistor 380 and N-type transistor 385 serving as an inverter to generate the output data signal "Z". The source port of N-type transistor 345 is coupled to ground (i.e., VSS) and the source port of N-type transistor 330 is coupled to the drain port of N-type clocked transistor 320.

The second transistor stack of the two cross-coupled transistor stacks includes P-type transistor 350, P-type transistor 355, and the parallel arrangement of N-type transistor 360 and N-type transistor 365. The source port of P-type transistor 350 is coupled to the supply voltage and the drain port of P-type transistor 350 is coupled to the source port of P-type transistor 355 and to the source port of P-type clocked transistor 310. The inverted input data signal (labeled as "dx") is coupled to the gate of P-type transistor 350 and to the gate of N-type transistor 365. The inverted data signal "dx" is generated by the P-type transistor 370 and N-type transistor 375 inverting the input data signal "D". The drain port of P-type transistor 355 is coupled to the drain ports of N-type transistors 360 and 365 and to the gates of P-type transistor 340 and N-type transistor 345 with this net labeled as "qt". The source gate of N-type transistor 360 is coupled to ground and the source gate of N-type transistor 365 is coupled to the drain gate of N-type clocked transistor 320.

The designed latch topology of latch 300 has lower internal power because latch 300 has no internal clock inverters which toggle during the idle condition. This is due to latch 300 being designed based on logic gate SR latch topology which uses a single phase, gate-fed clock input. This topology does not have a transmission gate multiplexer. A transmission gate multiplexer would require two phase clocks that are internally generated using two clock inverters due to the transmission gate noise issue.

However, a standard logic-gate SR latch would have more clock pin capacitance and would increase the external power in the upstream logic with higher switching activity.

This is why a typical logic-gate SR latch is not power efficient. Accordingly, latch 300 has been modified from the standard logic-gate SR latch structure to a new topology which has a lower clock pin capacitance. The lower clock pin capacitance is achieved by sharing the clocked transistors 310 and 320 between the forward and feedback path of the cross-coupled gate. With the shared transistor 310, the latch state is preserved by transistor 310 providing a path to VDD for either latch node (qt, qb) through D or dx transistors. One positive effect of swapping and sharing of the clocked transistors 310 and 320 is that the d2q delays are balanced for both the rising and falling edges. Another positive effect is a reduction in the transistor count and area compared to existing latch topologies.

Turning now to FIG. 4, a circuit diagram of one implementation of an SR B-latch 400 with a reduced number of clocked transistors is shown. The input signal "D" is coupled to an inverter made up of P-type transistor 430 and N-type transistor 435. The output of the inverter is the net labeled "dx" which is coupled to the gate of P-type transistor 470. The input clock signal is coupled to the gate of P-type clocked transistor 445, with the drain port of P-type clocked transistor 445 coupled to the source ports of P-type transistors 440 and 470. The source port of P-type clocked transistor 445 is coupled to the supply voltage. Also, the source ports of P-type transistors 450 and 465 are coupled to the supply voltage. The gate of P-type transistor 450 is coupled to the drain ports of P-type transistors 465 and 470 and N-type transistor 475 and to the gate of N-type transistor 455, and the gate of P-type transistor 465 is coupled to the drain ports of P-type transistors 440 and 450 and to the gates of N-type transistor 475, P-type transistor 490, and N-type transistor 495. The net connected to the gate of P-type transistor 450 is labeled "qt", and the net connected to the gate of P-type transistor 465 is labeled "qb".

The input clock signal is coupled to the gate of N-type clocked transistor 485. The drain port of N-type clocked transistor 485 is coupled to the source port of N-type transistor 455 and to the drain port of N-type transistor 460. The source port of N-type clocked transistor 485 is coupled to the source port of N-type transistor 475 and to the drain port of N-type transistor 480. The source ports of N-type transistor 460 and 480 are coupled to ground. The net labeled "qb" is coupled to the input of an inverter consisting of P-type transistor 490 and N-type transistor 495. The output of the inverter is the Z output data signal.

Figure 5:
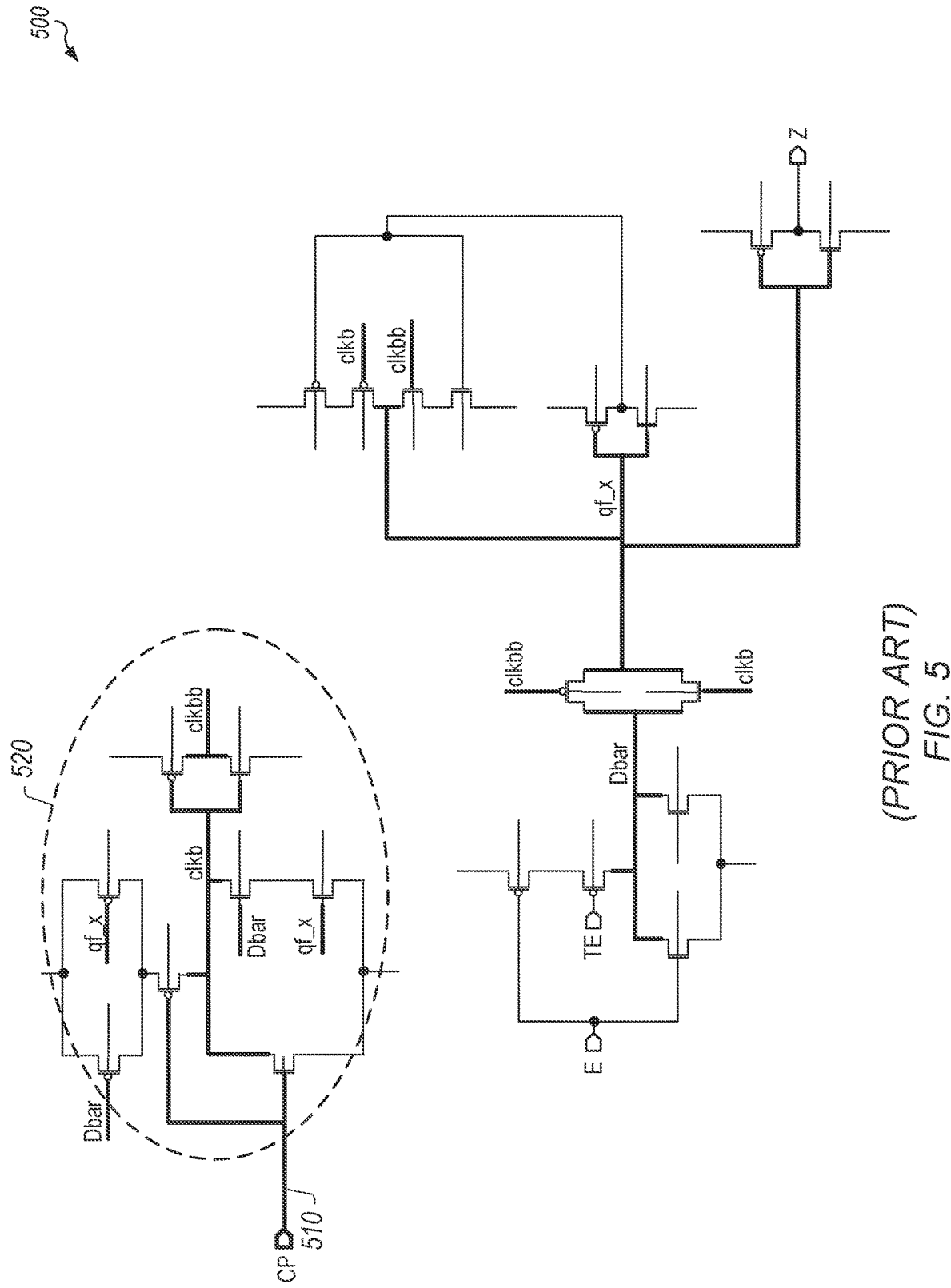
FIG. 5 is a block diagram of one implementation of a prior art low-power gating circuit.

Turning now to FIG. 5, a circuit diagram of one implementation of a prior art low-power gating circuit 500 is shown. The bottom portion of gating circuit 500 is a NOR-gate for enable (or E) and test enable (or TE) input signals followed by a transmission gate. And then back-to-back inverters. At the top of FIG. 5 in circle 520, there is a self-gating of the clock 510. Accordingly, if the previous state of the latch enable input was 1 and the current state is 1, this will prevent clkb and clkbb from switching. However, this circuit saves power only for that condition when latch enable input remains 1 for consecutive cycles.

Figure 6:
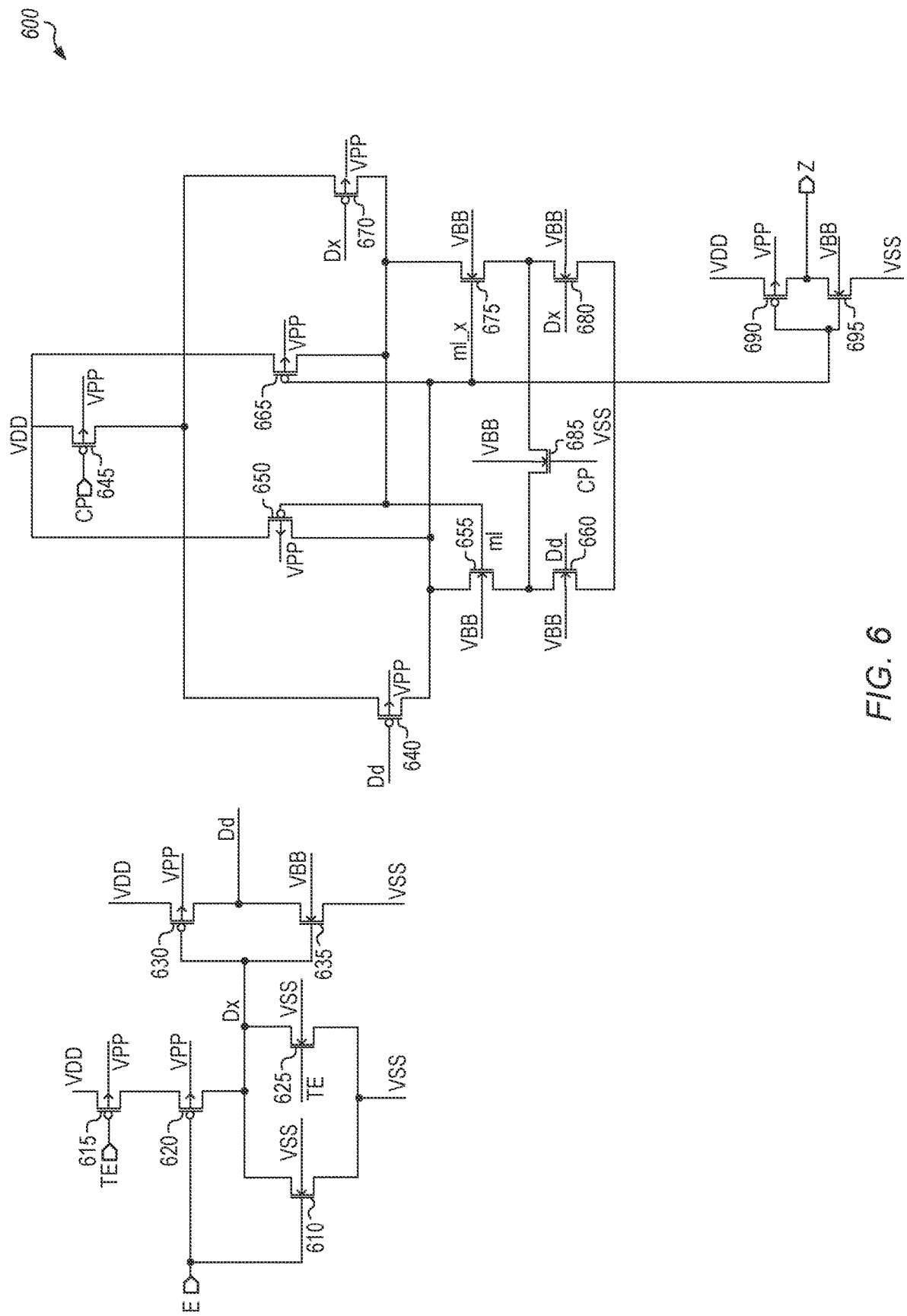
FIG. 6 is a block diagram of another implementation of an OR2 B-latch.

Referring now to FIG. 6, a circuit diagram of one implementation of an OR2 B-latch 600 is shown. OR2 B-latch 600 includes only two clocked transistors 645 and 685 similar to latch 300 (of FIG. 3). OR2 B-latch 600 is an improvement over gating circuit 500 (of FIG. 5) by virtue of having internal clock gating for all input data conditions rather than just for consecutive 1's as is the case for gating circuit 500. As shown in FIG. 6, the input enable signal is coupled to the gates of N-type transistor 610 and P-type transistor 620. The input test enable signal is coupled to the gates of P-type transistor 615 and N-type transistor 625. P-type transistor 615, P-type transistor 620, and the parallel arrangement of N-type transistors 610 and 625 form a transistor stack which is coupled to an inverter made up of P-type transistor 630 and N-type transistor 635. The output of the inverter is the net labeled "Dd" which is coupled to the gate of P-type transistor 640.

The input clock signal is coupled to the gate of P-type clocked transistor 645, with the drain port of P-type clocked transistor 645 coupled to the source ports of P-type transistors 640 and 670. The source port of P-type clocked transistor 645 is coupled to the supply voltage. Also, the source ports of P-type transistors 650 and 665 are coupled to the supply voltage. The gate of P-type transistor 650 is coupled to the drain ports of P-type transistors 665 and 670 and N-type transistor 675 and to the gate of N-type transistor 655, and the gate of P-type transistor 665 is coupled to the drain ports of P-type transistors 640 and 650 and to the gates of N-type transistor 675, P-type transistor 690, and N-type transistor 695. The net connected to the gate of P-type transistor 650 is labeled "ml", and the net connected to the gate of P-type transistor 665 is labeled "ml_x".

The input clock signal is coupled to the gate of N-type clocked transistor 685.

The drain port of N-type clocked transistor 685 is coupled to the source port of N-type transistor 655 and to the drain port of N-type transistor 660. The source port of N-type clocked transistor 685 is coupled to the source port of N-type transistor 675 and to the drain port of N-type transistor 680. The source ports of N-type transistor 660 and 680 are coupled to ground. The net labeled "ml_x" is coupled to the input of an inverter consisting of P-type transistor 690 and N-type transistor 695. The output of the inverter is the Z output data signal.

Both the A-latch 300 and B-latch 400 can be used in a variety of circuits. For example, in one implementation, B-latch 400 is used in OR2 B-latch 600 clock gating circuit. Based on the design of OR2 B-latch 600, the clock gating circuit has reduced dynamic power consumption as compared with traditional designs. In other implementations, A-latch 300 and B-latch 400 can be combined to design a low-power flip-flop or different types of logic clock gating circuits or any of various other types of circuits.

Figure 7:
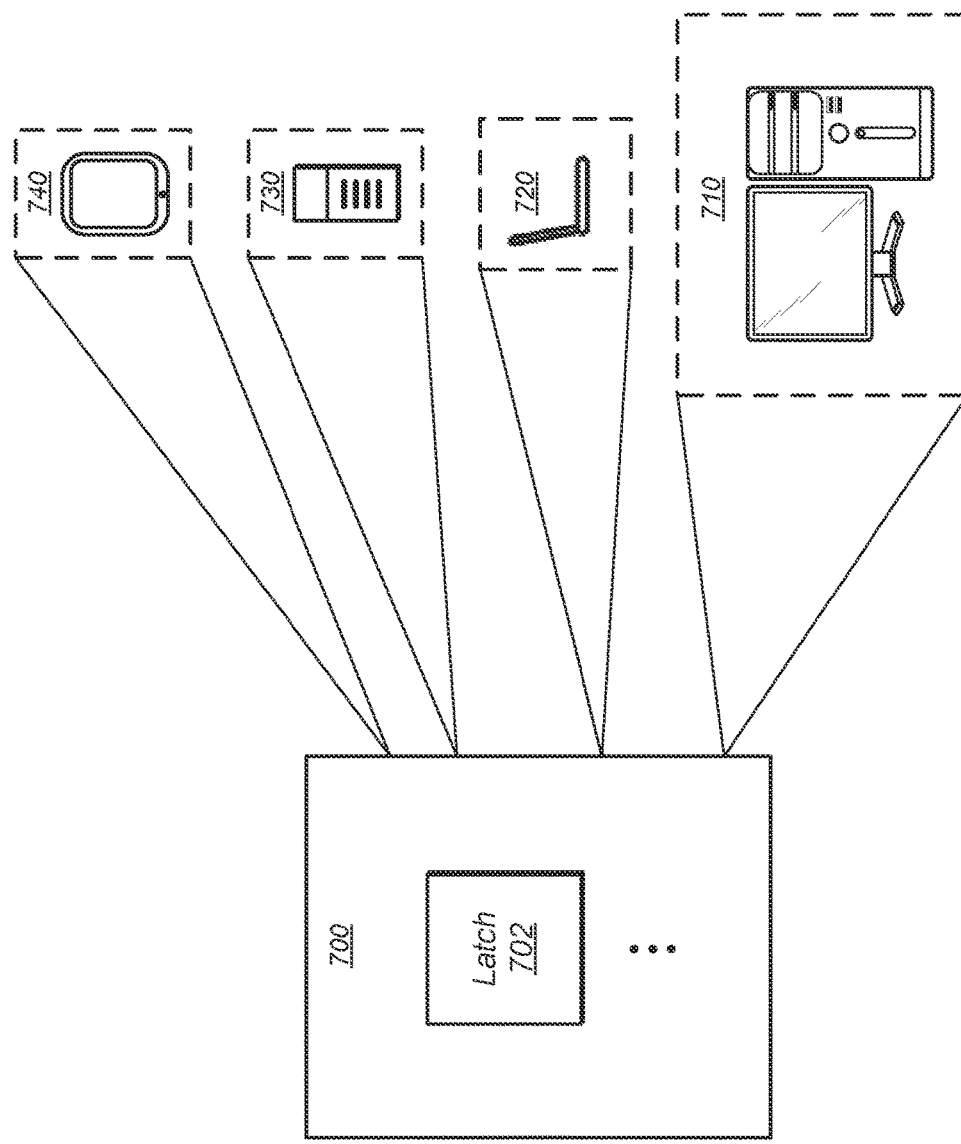
FIG. 7 is a block diagram of one implementation of an apparatus.

Turning now to FIG. 7, a block diagram of one implementation of an apparatus 700 is shown. As shown, apparatus 700 represents at least a portion of the chips, circuitry, components, etc., of a desktop computer 710, laptop computer 720, server 730, mobile device 740, or otherwise. Other systems, apparatuses, and devices (e.g., game consoles, wearable devices, Internet of things (IoT) devices) are possible and are contemplated. In the illustrated implementation, the apparatus 700 includes any number of latches 702 as well as other circuitry.

Figure 8:
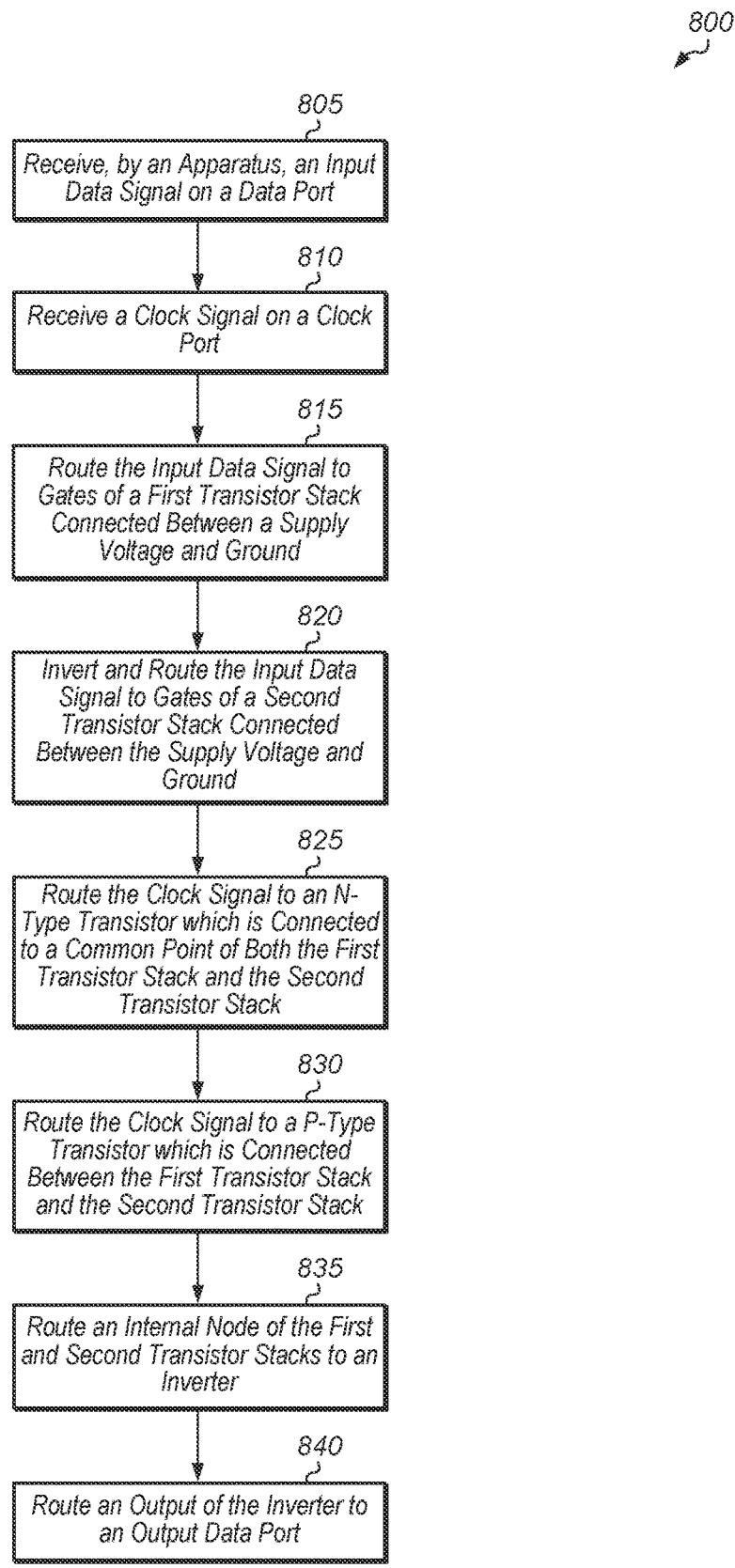
FIG. 8 is a generalized flow diagram illustrating one implementation of a method for operating an apparatus.
Figure 9:
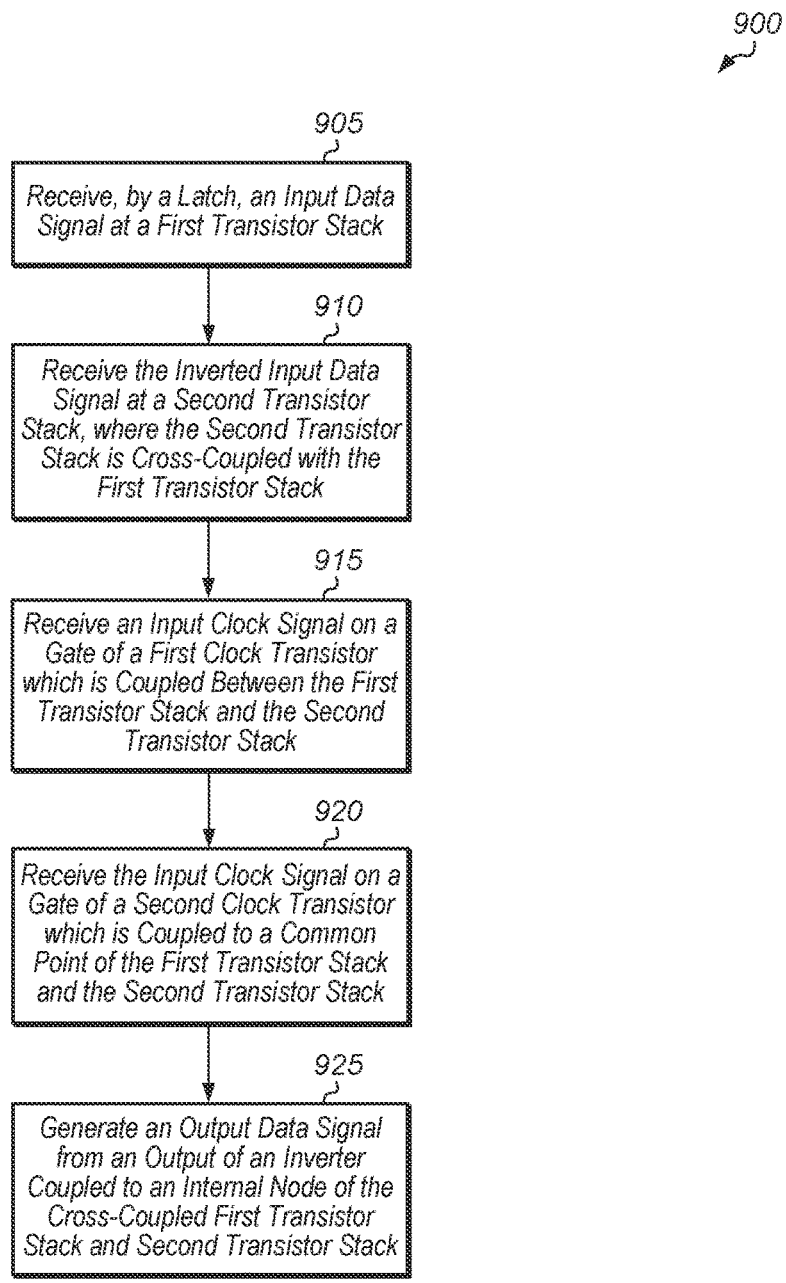
FIG. 9 is a generalized flow diagram illustrating one implementation of a method for operating a low-power, single-phase logic gate latch.

Referring now to FIG. 8, one implementation of a method 800 for operating an apparatus is shown. For purposes of discussion, the steps in this implementation and those of FIG. 9 are shown in sequential order. However, it is noted that in various implementations of the described methods, one or more of the elements described are performed concurrently, in a different order than shown, or are omitted entirely. Other additional elements are also performed as desired. Any of the various systems or apparatuses described herein are configured to implement method 800 (and method 900).

An apparatus receives an input data signal on a data port (block 805). The apparatus also receives a clock signal on a clock port (block 810). The input data signal is routed to gates of a first transistor stack connected between a supply voltage and ground (block 815). The input data signal is also inverted (i.e., passed through an inverter) and routed to gates of a second transistor stack connected between the supply voltage and ground (block 820). The clock signal is routed to an N-type transistor which is connected to a common point of both the first transistor stack and the second transistor stack (block 825). The clock signal is also routed to a P-type transistor which is connected between the first transistor stack and the second transistor stack (block 830). An internal node of the first and second transistor stacks is routed to an inverter (block 835). The apparatus routes an output of the inverter to an output data port (block 840). After block 840, method 800 ends.

Turning now to FIG. 9, one implementation of a method 900 for operating a low-power, single-phase logic gate latch is shown. A latch receives an input data signal at a first transistor stack (block 905). The latch also receives the inverted input data signal at a second transistor stack, where the second transistor stack is cross-coupled with the first transistor stack (block 910). The latch receives an input clock signal on a gate of a first clocked transistor which is coupled between the first transistor stack and the second transistor stack (block 915). The latch also receives the input clock signal on a gate of a second clocked transistor which is coupled to a common point of the first transistor stack and the second transistor stack (block 920). The latch generates an output data signal from an output of an inverter coupled to an internal node of the cross-coupled first and second transistor stacks (block 925). After block 925, method 900 ends.

Figure 10:
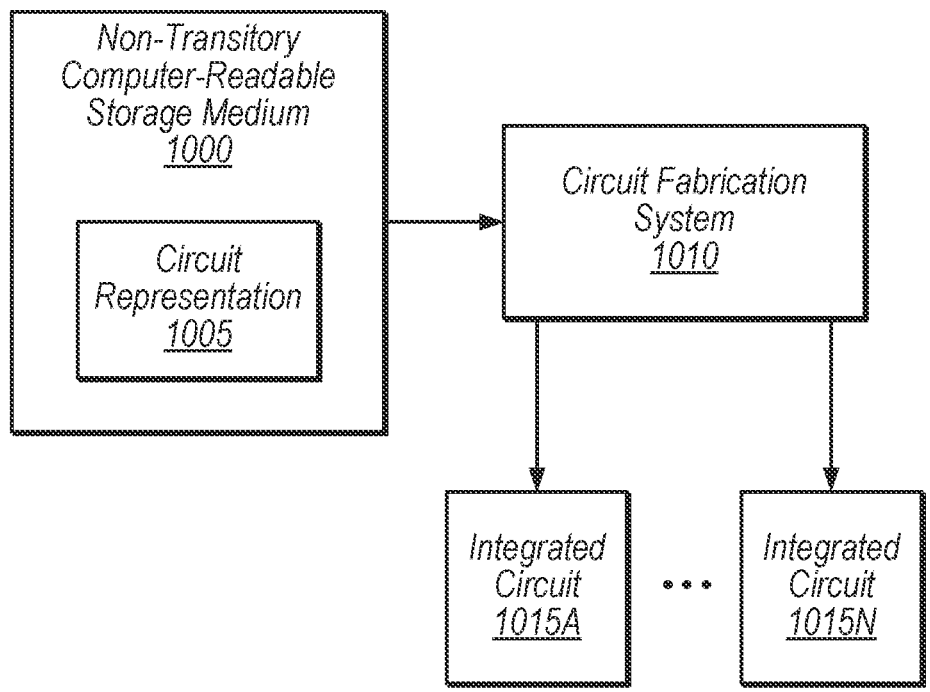
FIG. 10 is a block diagram illustrating one implementation of a non-transitory computer-readable storage medium that stores a circuit representation.

Referring now to FIG. 10, a block diagram illustrating one implementation of a non-transitory computer-readable storage medium 1000 that stores a circuit representation 1005 is shown. In one implementation, circuit fabrication system 1010 processes the circuit representation 1005 stored on non-transitory computer-readable storage medium 1000 and fabricates any number of integrated circuits 1015A-N based on the circuit representation 1005.

Non-transitory computer-readable storage medium 1000 can include any of various appropriate types of memory devices or storage devices. Medium 1000 can be an installation medium (e.g., a thumb drive, CD-ROM), a computer system memory or random access memory (e.g., DRAM, DDR RAM, SRAM, EDO RAM, Rambus RAM), a non-volatile memory (e.g., a Flash, magnetic media, a hard drive, optical storage), registers, or other types of memory elements. Medium 1000 can include other types of non-transitory memory as well or any combinations thereof. Medium 1000 can include two or more memory mediums which reside in different locations (e.g., in different computer systems that are connected over a network).

In various implementations, circuit representation 1005 is specified using any of various appropriate computer languages, including hardware description languages such as, without limitation: VHDL, Verilog, SystemC, SystemVerilog, RHDL, etc. Circuit representation 1005 is usable by circuit fabrication system 1010 to fabricate at least a portion of one or more of integrated circuits 1015A-N. The format of circuit representation 1005 is recognizable by at least one circuit fabrication system 1010. In some implementations, circuit representation 1005 includes one or more cell libraries which specify the synthesis and/or layout of the integrated circuits 1015A-N.

Circuit fabrication system 1010 includes any of various appropriate elements configured to fabricate integrated circuits. This can include, for example, elements for depositing semiconductor materials (e.g., on a wafer, which can include masking), removing materials, altering the shape of deposited materials, modifying materials (e.g., by doping materials or modifying dielectric constants using ultraviolet processing), etc. Circuit fabrication system 1010 can also perform testing of fabricated circuits for correct operation.

In various implementations, integrated circuits 1015A-N operate according to a circuit design specified by circuit representation 1005, which can include performing any of the functionality described herein. For example, integrated circuits 1015A-N can include any of various elements shown in the circuits illustrated herein and/or multiple instances of the circuit illustrated herein. Furthermore, integrated circuits 1015A-N can perform various functions described herein in conjunction with other components. For example, integrated circuits 1015A-N can be coupled to voltage supply circuitry that is configured to provide a supply voltage (e.g., as opposed to including a voltage supply itself). Further, the functionality described herein can be performed by multiple connected integrated circuits.

As used herein, a phrase of the form "circuit representation that specifies a design of a circuit . . . " does not imply that the circuit in question must be fabricated in order for the element to be met. Rather, this phrase indicates that the circuit representation describes a circuit that, upon being fabricated, will be configured to perform the indicated actions or will include the specified components.

It should be emphasized that the above-described implementations are only non-limiting examples of implementations. The implementations are applied for up-scaled, down-scaled, and non-scaled images. Numerous variations and modifications will become apparent to those skilled in the art once the above disclosure is fully appreciated. It is intended that the following claims be interpreted to embrace all such variations and modifications.

What is claimed is:

1. A latch comprising:
   a pair of cross-coupled transistor stacks comprising a first transistor stack and a second transistor stack;
   a first clocked transistor coupled between the first transistor stack and the second transistor stack;
   a second clocked transistor coupled to a common point of the first transistor stack and the second transistor stack;
   a first input port configured to receive an enable signal; and
   a clock port configured to receive an input clock signal, wherein the input clock signal is coupled to a gate of the first clocked transistor and to a gate of the second clocked transistor;
   wherein the latch is configured to set an output data signal based on an input data signal and the input clock signal, wherein a value of the input data signal is based at least in part on a value of the enable signal.

2. The latch as recited in claim 1, further comprising a second input port configured to receive the input data signal, wherein the input data signal is coupled to the first transistor stack.

3. The latch as recited in claim 2, wherein the input data signal is coupled to a gate of a first P-type transistor of the first transistor stack, and wherein the input data signal is coupled to a gate of a first N-type transistor of the first transistor stack.

4. The latch as recited in claim 2, wherein an inverted version of the input data signal is coupled to the second transistor stack.

5. The latch as recited in claim 4, the inverted version of the input data signal is coupled to a gate of a first P-type transistor of the second transistor stack, and wherein the inverted version of the input data signal is coupled to a gate of a first N-type transistor of the second transistor stack.

6. The latch as recited in claim 2, wherein;
   the first clocked transistor is a P-type transistor coupled between the first transistor stack and the second transistor stack; and
   the second clocked transistor is a first N-type transistor coupled to a source gate of a second N-type transistor of the first transistor stack gated by the input data signal and to a source gate of a third N-type transistor of the second transistor stack gated by an inverted version of the input data signal.

7. The latch as recited in claim 1, further comprising a total of two clocked transistors that includes the first clocked transistor and the second clocked transistor.

8. A method comprising:
   receiving an enable signal by an input port of a latch;
   receiving, by a latch, an input data signal on gates of a first P-type transistor and a first N-type transistor of a first transistor stack, wherein a value of the input data signal is based at least in part on a value of the enable signal;
   receiving an inverted version of the input data signal on gates of a second P-type transistor and a second N-type transistor of a second transistor stack, wherein the first transistor stack is cross-coupled to the second transistor stack;
   receiving an input clock signal at a P-type clocked transistor coupled between the first transistor stack and the second transistor stack;
   receiving the input clock signal at an N-type clocked transistor connected to a common point of the cross-coupled first and second transistor stacks; and
   generating an output data signal by inverting an internal node of the cross-coupled first and second transistor stack.

9. The method as recited in claim 8, wherein the P-type clocked transistor is coupled to a drain port of the first P-type transistor of the first transistor stack.

10. The method as recited in claim 9, wherein the P-type clocked transistor is coupled to a drain port of the second P-type transistor of the second transistor stack.

11. The method as recited in claim 10, wherein a drain port of the N-type clocked transistor is coupled to:
    a source port of the first N-type transistor of the first transistor stack; and
    a source port of the second N-type transistor of the second transistor stack.

12. The method as recited in claim 11, further comprising receiving the input clock signal by a total of two clocked transistors that includes the N-type clocked transistor and the P-type clocked transistor.

13. The method as recited in claim 11, wherein a source port of the N-type clocked transistor is coupled to ground.

14. The method as recited in claim 13, wherein the drain port of the first P-type transistor of the first transistor stack is coupled to a third P-type transistor of the first transistor stack, and wherein the drain port of the second P-type transistor of the second transistor stack is coupled to a fourth P-type transistor of the second transistor stack.

15. An apparatus comprising:
    an input port configured to receive an enable signal;
    a data port configured to receive an input data signal, wherein a value of the input data signal is based at least in part on a value of the enable signal;
    a clock port configured to receive a clock signal;
    a first transistor stack connected between a supply voltage and ground;
    a second transistor stack connected between the supply voltage and ground;
    an N-type clocked transistor configured to receive the clock signal from the clock port, wherein the N-type clocked transistor is coupled to a common point of both the first transistor stack and the second transistor stack; and
    a P-type clocked transistor configured to receive the clock signal from the clock port, wherein the P-type clocked transistor is coupled between the first transistor stack and the second transistor stack;
    wherein the apparatus is configured to generate an output data signal from the input data signal based on a first inverter coupled to the first and second transistor stacks.

16. The apparatus as recited in claim 15, wherein the input data signal is coupled to a gate of a first P-type transistor of the first transistor stack.

17. The apparatus as recited in claim 16, further comprising a second inverter, wherein:
  the input data signal is coupled to a gate of a first N-type transistor of the first transistor stack; and
  the input data signal is coupled to the second inverter.

18. The apparatus as recited in claim 17 15, further comprising a total of two clocked transistors that includes the N-type clocked transistor and the P-type clocked transistor.

19. The apparatus as recited in claim 17, wherein an output of the second inverter is coupled to a gate of a second P-type transistor of the second transistor stack, and wherein the output of the second inverter is coupled to a gate of a second N-type transistor of the second transistor stack.

20. The apparatus as recited in claim 19, wherein the N-type clocked transistor is coupled to a source port of the first N-type transistor of the first transistor stack and to a source port of the second N-type transistor of the second transistor stack, and wherein the P-type clocked transistor is coupled between a drain port of the first P-type transistor of the first transistor stack and a drain port of the second P-type transistor of the second transistor stack.

* * * * *

UNITED STATES PATENT AND TRADEMARK OFFICE
CERTIFICATE OF CORRECTION

PATENT NO. : 12,160,238 B2
APPLICATION NO. : 17/563980
DATED : December 3, 2024
INVENTOR(S) : Baksh et al.

It is certified that error appears in the above-identified patent and that said Letters Patent is hereby corrected as shown below:

In the Claims

Column 7, Claim 6, Line 55, please delete "in claim 2, wherein;" and insert -- in claim 2, wherein: --.

Column 9, Claim 18, Line 9, please delete "in claim 17 15," and insert -- in claim 15, --.

Signed and Sealed this
Twenty-ninth Day of April, 2025

Coke Morgan Stewart
*Acting Director of the United States Patent and Trademark Office*